United States Patent [19]

Aschwanden

[11] 4,092,672
[45] May 30, 1978

[54] MASTER OSCILLATOR SYNCHRONIZING SYSTEM

[75] Inventor: Felix Aschwanden, Thalwil, Switzerland

[73] Assignee: RCA Corporation, New York, N.Y.

[21] Appl. No.: 776,711

[22] Filed: Mar. 11, 1977

[30] Foreign Application Priority Data

Nov. 15, 1976 United Kingdom ............... 47546/76

[51] Int. Cl.² ............................................. H04N 5/12
[52] U.S. Cl. .................................................. 358/149
[58] Field of Search ................. 178/53, 69.1; 358/148, 358/149, 158; 179/15 BS; 328/55, 63, 133, 134; 331/1 A, 1 R, 14, 18, 25, 34

[56] References Cited
U.S. PATENT DOCUMENTS 3,904,823  9/1975  Van Straaten ........................ 358/158
4,025,951  5/1977  Elkenbrecht ......................... 358/148

Primary Examiner—Benedict V. Safourek
Attorney, Agent, or Firm—Eugene M. Whitacre; Paul J. Rasmussen; Mason DeCamillis

[57] ABSTRACT

A synchronizing system is provided for synchronizing an oscillator having two or more substantially different frequencies, developed by division of the oscillator output frequency, from an external reference signal. The external reference is utilized as one input to a phase detector and to reset the divider. The divider is re-enabled by the external reference so that the next divider output is applied to the other input of the phase detector. The two inputs to the phase detector are now timed within a narrow range, which is within the pull-in range of the control loop, which minimizes the phase lock up time for synchronizing to the external reference.

3 Claims, 7 Drawing Figures

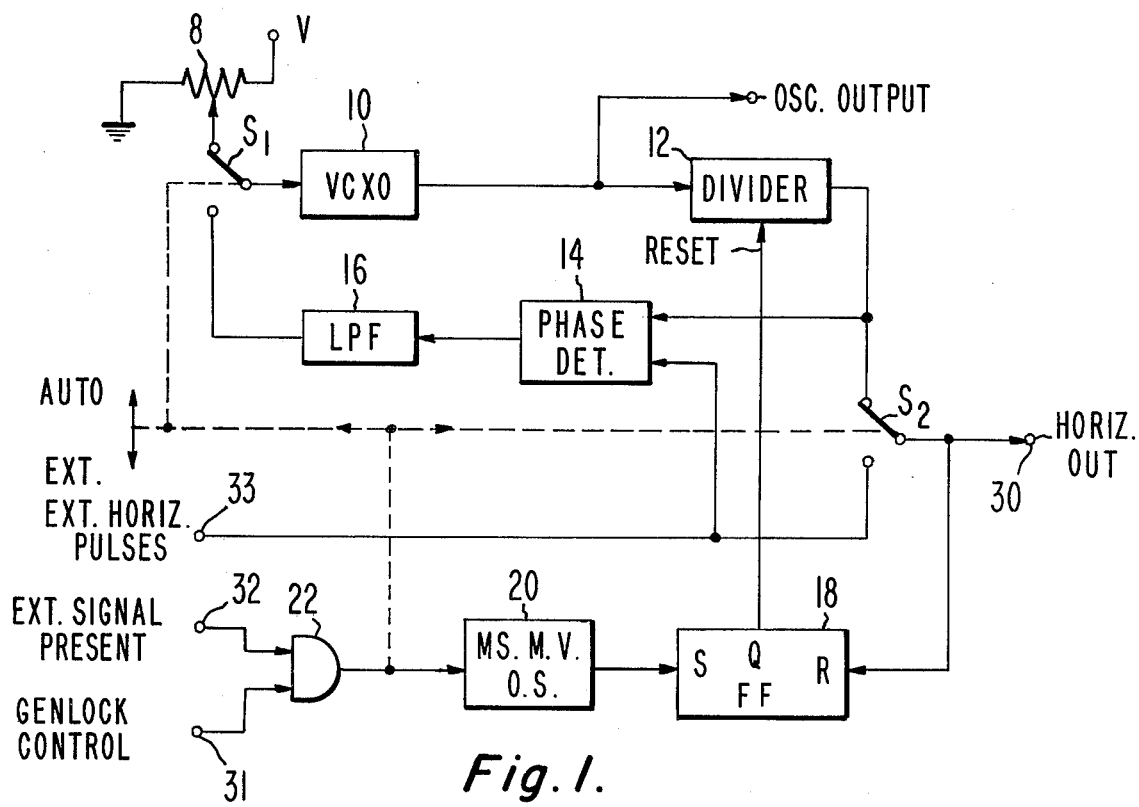
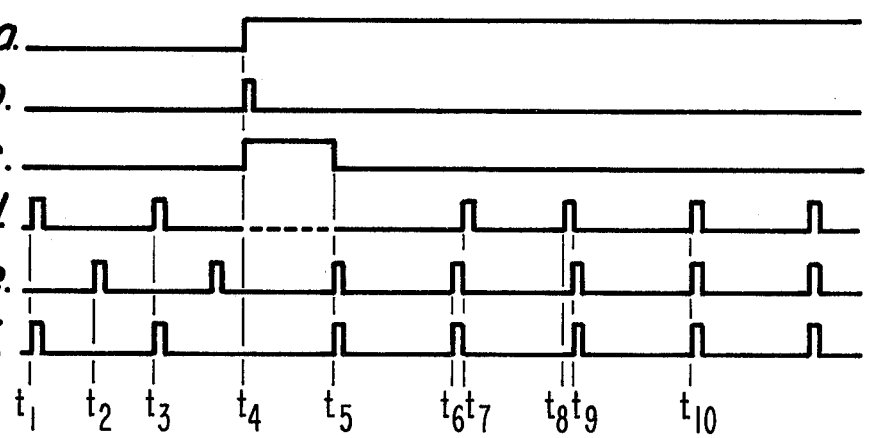

MASTER OSCILLATOR SYNCHRONIZING SYSTEM

BACKGROUND OF THE INVENTION

This invention relates to oscillator synchronizing systems and, in particular, to synchronizing oscillators from a reference signal substantially different in frequency than the operating frequency of the oscillator.

Master reference oscillators are often used in systems wherein a number of secondary frequencies are derived from the output frequency of the master oscillator. One such use is in television systems wherein a master oscillator operating at a relatively high frequency is coupled to frequency dividers to generate horizontal line and vertical field synchronizing signals, all of which are locked in frequency and phase to the master oscillator. Oscillators designed to serve as master reference oscillators are generally of the types known as oven-stabilized or temperature compensated and, as such, are optimized in performance for a discrete frequency with a limited variable frequency adjustment on the order of ±5ppm.

In practice, one or more master oscillators in a system may be combined by way of synchronization which requires that the multiple oscillators be locked together in frequency and phase by what is commonly referred to as generator locking or Genlock operation. In Genlock operation, an external signal, generally at a low rate, e.g., the horizontal line rate in a television system, from one master oscillator which serves as a system reference, is utilized to lock the other master oscillators to the system reference. A phase detector in each master oscillator loop compares its equivalent secondary frequency, e.g., its horizontal line rate signal to the external system reference, which is at the horizontal line rate. Any difference in phasing between the two inputs to the phase detector causes the phase detector to produce an error signal, which is coupled to a control input of the local master oscillator to bring its output signal into phase with the external reference signal, thereby synchronizing the local master oscillator to the system. If the phase difference between the local and system reference frequencies is relatively large, an appreciable time, e.g., up to 60 seconds, may be required before synchronism of all of the secondary frequencies is achieved due to the relatively high rate of division of the master oscillator output frequency used to generate the lower secondary frequency and the limited range of master oscillator variation normally available.

Prior art attempts at reducing the time required for bringing a local master oscillator into synchronism generally require the use of two or more external reference signals. In one such system, a first reference of a frequency at or near the local master oscillator output frequency is used to correct the local master oscillator, while a second reference signal at the lower secondary frequency rate is utilized to reset the divider circuit which develops the lower secondary frequency. However, the substantial difference in the frequency rate of the two or more external reference signals may create a substantial time and phasing displacement of the lower secondary frequency output signal depending on the countdown status of the divider circuit at the time the reset is attempted.

SUMMARY OF THE INVENTION

A system is provided for synchronizing an oscillator circuit having two or more output signals of substantially different frequencies from a single external reference signal. The system comprises an oscillator circuit for generating a first output signal to which is coupled divider circuit means for developing a second output signal from the first output signal. Phase detector means responsive to the second output signal and to a source of external reference signal substantially at the same frequency as the second output signal are provided for developing a phasing control signal indicative of the phasing difference between the second output signal and the external reference signal. Coupling means are provided for coupling the phasing control signal to the oscillator so as to bring the second output signal and the external reference signal into phase coincidence. Control means coupled to the divider circuit means are responsive to a synchronizing control signal for resetting the divider circuit means upon application of the synchronizing control signal to the control means. The control means are further responsive to the first occurring external reference signal after application of the synchronizing control signal for enabling the divider means.

BRIEF DESCRIPTION OF THE DRAWINGS

FIG. 1 is a block diagram of a master oscillator circuit embodying the invention; and FIGS. 2a – 2f are waveforms depicting the operation of the block diagram of FIG. 1.

DESCRIPTION OF THE DRAWINGS

In FIG. 1, a master voltage controlled oscillator (VCXO) 10 is operated at a discrete frequency under control of a bias voltage 8 coupled between a source of potential V and a point of reference (ground). The output of the master oscillator is coupled to an output terminal (OSC Output) and to the input of a divider circuit 12. Divider circuit 12 is arranged in a known manner to divide the output frequency from master oscillator 10 by an desired number $n$ depending on the discrete frequency chosen for master oscillator 10 and the desired lower secondary frequency. A typical example for the SECAM television standards being: a master oscillator 10 frequency of 4,406,250 Hz; where $n$ equals 282 and the lower secondary frequency is 15625 Hz, the desired horizontal line rate. The output of divider circuit 12 is coupled to one input terminal of a phase detector 14 and by means of a switch $S_2$ to an output terminal 30, where it is available at the local horizontal timing reference (waveform 2f). In the Genlock mode of operation, a genlock control signal is coupled to one input 31 of an AND gate 22. If the external horizontal signal to which synchronization is to be made is present at terminal 33, a related control signal is coupled to the other input terminal 32 of AND gate 22. The output signal of AND gate 22 in the form of a level change ($t_4$ of waveform 2a) is a change-over-command signal which causes switches $S_1$ and $S_2$, shown diagrammatically, to assume the EXT position and also triggers a one-shot monostable multivibrator circuit 20 ($t_4$ of waveform 2b). The output signal of multivibrator circuit 20 is coupled to the set terminal of a set-reset flip-flop 18. The Q output ($t_4 - t_5$ of waveform 2c) of flip-flop 18 is coupled to the reset terminal of divider 12, where it resets divider 12 to a zero count, interrupting the generation of the horizontal timing reference from divider 12 ($t_4 - t_5$ of waveform 2d). The external synchronizing reference signal (waveform 2f) coupled to terminal 33 is coupled to the other input of phase detector 14 and by means of switch S₂ to terminal 30. As previously described, phase detector 14 develops a control signal indicative of the phase difference between the internally generated signal; i.e., the output of divider 12 and the externally applied reference signal. However, since the control input of master oscillator 10 is coupled by switch S₁ to the output of phase detector 14 by means of a low-pass filter 16 and the divider 12 is held at zero count by means of the control signal applied to its reset terminal by the output of flip-flop 18, one input to the phase detector is at zero, resulting in a undefined control voltage at the control input of the master oscillator. The very next EXT horizontal timing pulse to occur ($t_5$ of waveform 2e), which appears at the output terminal 30, resets flip-flop 18, which, in turn, causes the Q output of flip-flop 18 to go low ($t_5$ of waveform 2c), and divider 12 is again enabled. When divider 12 reaches its preassigned count the pulse output is divider 12 ($t_7$ of waveform 2d), appears and is applied to the open input of phase detector 14. Since the master oscillator 10 has only a small amount of frequency variation, it follows that this first output pulse is quite close in timing to the external horizontal timing pulse train that initiated the countdown in divider 12. Phase detector 14 now receives, as the two signals for comparison, an external pulse $t_6$ of waveform 2e and a divider output pulse $t_7$ of waveform 2d. The location of divider output pulse at time $t_7$ of waveform 2d indicates master oscillator 10 was running slow in the absence of a control input from phase detector 14. Phase detector 14, having its two input signals, as described above, develops a control signal for the control input of master oscillator 10, which speeds up oscillator 10. The very next output pulse from divider 12 ($t_8$ of waveform 2d) is shown as now being too early but again very close to the proper external horizontal timing pulse ($t_9$ of waveform 2e). The phase detector again makes the phase comparison and the next external horizontal timing pulse at $t_{10}$ of waveform 2e shows that the divider output at $t_{10}$ of waveform 2d and the output at terminal 30 at $t_{10}$ of waveform 2f are all synchronous. Thus, the required time for full synchronism of the master oscillator and secondary frequency output signals has been achieved in as little as two to three countdowns of divider 12, reducing the phase lock-up time required to a minimum and with little or no disturbance to the external circuitry driven by the substantially differing frequencies.

What is claimed is:

1. A system for sychronizing an oscillator circuit having two or more output signals of substantially different frequencies from a single external reference signal, comprising:

an oscillator circuit for generating a first output signal;

divider circuit means coupled to said oscillator for developing a second output signal from said first output signal;

a source of external reference signal at substantially the same frequency as said second output signal;

phase detector means responsive to said second output signal and said external reference signal for developing a phasing control signal indicative of the phasing difference between said second output signal and said external reference signal;

means for coupling said phasing control signal to said oscillator so as to bring said second output signal and said external reference signal into phase coincidence;

control means coupled to said divider circuit means, said control means being responsive to a synchronizing control signal for resetting said divider circuit means upon application of said synchronizing control signal to said control means and further responsive to the first occurring external reference signal after application of said synchronizing signal for enabling said divider circuit means.

2. A system for synchronizing an oscillator circuit according to claim 1 wherein said control means comprises a one-shot multivibrator and a set-reset flip-flop.

3. A system for synchronizing an oscillator circuit according to claim 2 wherein said oscillator develops the horizontal line and field rate signals for a television system, said first output signal being at a frequency corresponding to said horizontal line rate signal and said second output signal being at a frequency corresponding to said field rate signal.

* * * * *